United States Patent
Pril

(10) Patent No.: US 7,535,578 B2
(45) Date of Patent: May 19, 2009

(54) LITHOGRAPHIC APPARATUS AND INTERFEROMETER SYSTEM

(75) Inventor: Wouter Onno Pril, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 381 days.

(21) Appl. No.: 10/899,437

(22) Filed: Jul. 27, 2004

(65) Prior Publication Data

US 2005/0078288 A1 Apr. 14, 2005

(30) Foreign Application Priority Data

Jul. 30, 2003 (EP) ................................ 03077397

(51) Int. Cl.
*G01B 9/02* (2006.01)
(52) U.S. Cl. ..................................... 356/486
(58) Field of Classification Search ................ 356/486, 356/493, 498, 500
See application file for complete search history.

(56) References Cited

U.S. PATENT DOCUMENTS

| | | | | |
|---|---|---|---|---|
| 5,106,191 A | * | 4/1992 | Ohtsuka | 356/487 |
| 5,521,704 A | * | 5/1996 | Thiel et al. | 356/486 |
| 5,631,736 A | * | 5/1997 | Thiel et al. | 356/486 |
| 5,748,315 A | * | 5/1998 | Kawai et al. | 356/484 |
| 6,538,746 B1 | * | 3/2003 | Handrich | 356/482 |
| 6,897,963 B1 | | 5/2005 | Taniguchi et al. | |
| 7,110,121 B2 | * | 9/2006 | Tsai | 356/498 |

FOREIGN PATENT DOCUMENTS

| | | |
|---|---|---|
| DE | 43 35 036 A | 4/1994 |
| DE | 100 38 346 A | 6/2001 |
| EP | 0 974 868 A2 | 1/2000 |
| JP | 7-139907 | 6/1995 |
| JP | 08-159710 | 6/1996 |
| JP | 2000-164504 | 6/2000 |
| JP | 2000-275012 | 10/2000 |
| JP | 2001-044112 | 2/2001 |
| WO | WO 99/64817 A | 12/1999 |
| WO | WO 00/65301 A | 11/2000 |

OTHER PUBLICATIONS

European Search Report for Application No. 03077397.2, dated May 19, 2004.
Jennewein H. et al., "Absolute distance measurements with a fiber optic interferometer," *Technisches Messen*, 2000, 67(10): 410-14.

* cited by examiner

*Primary Examiner*—Tarifur Chowdhury
*Assistant Examiner*—Jonathan M Hansen
(74) *Attorney, Agent, or Firm*—Pillsbury Winthrop Shaw Pittman LLP

(57) ABSTRACT

A lithographic apparatus is presented that includes a substrate holder configured to hold a substrate, an illuminator configured to condition a beam of radiation, a support structure configured to support a patterning device that imparts a desired pattern to the beam of radiation, a projection system that projects the patterned beam onto a target portion of the substrate, and an interferometer system configured to measure a position of the object to assist in positioning the object.

25 Claims, 4 Drawing Sheets

LITHOGRAPHIC APPARATUS AND INTERFEROMETER SYSTEM

PRIORITY INFORMATION

This application claims priority from European Patent Application No. 03077397.2, filed Jul. 30, 2003, the contents being herein incorporated by reference in its entirety.

BACKGROUND OF THE INVENTION

1. Field of the Invention

The present invention relates to a lithographic apparatus and an interferometer system.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

The term "patterning device" as here employed should be broadly interpreted as referring to a device that can be used to impart an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

- a mask: the concept of a mask (also known as a "reticle") is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table/holder/holder, which ensures that the mask can be held at a desired position in the incoming radiation beam, and that it can be moved relative to the beam if so desired;
- a programmable mirror array: one example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation mechanism. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and
- a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table/holder/holder; however, the general principles discussed in such instances should be seen in the broader context of the patterning device as set forth here above.

In general, a single wafer will contain a whole network of adjacent target portions that are successively irradiated via the projection system, one at a time. In current apparatus, employing patterning by a mask on a mask table/holder/holder, a distinction can be made between two different types of machine. In one type of lithographic projection apparatus, each target portion is irradiated by exposing the entire mask pattern onto the target portion in one go; such an apparatus is commonly referred to as a wafer stepper.

In an alternative apparatus—commonly referred to as a step-and-scan apparatus—each target portion is irradiated by progressively scanning the mask pattern under the projection beam in a given reference direction (the "scanning" direction) while synchronously scanning the substrate table/holder/holder parallel or anti-parallel to this direction. Since, in general, the projection system will have a magnification factor M (generally <1), the speed V at which the substrate table/holder/holder is scanned will be a factor M times that at which the mask table/holder/holder is scanned. More information with regard to lithographic devices as here described can be gleaned, for example, from U.S. Pat. No. 6,046,792, incorporated herein by reference.

In a manufacturing process using a lithographic apparatus, a pattern (e.g. as defined by a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate table/holder/holders (and/or two or more mask table/holders). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

The ever present demand in lithography to image mask patterns with a small critical dimensions (CD) necessitates increasing accuracy of the positioning of the substrate table, the substrate and/or any other object which is moveable within the apparatus. This drives the need for ever increasing accuracy of the knowledge of a position of such objects.

Conventional interferometer systems are often capable of accurately carrying out a well known measurement of a difference in phase between light which has traveled along a reference path and light which has traveled along a measurement path. In this specification, these type of measurements are referred to as phase measurements. A measured change of difference in phase corresponds to a displacement of an object. In other words, a phase measurement can be regarded as a displacement measurement. Although a phase measurement provides some information on a displacement of an object, information is only provided with respect to a previous location of that object itself.

In this specification, a position is to be understood to mean a position that is defined with respect to a known position that is stable in time. A position of an object is defined with respect to a reference position, stable in time of, for instance, another object, lens, or axis within the lithographic apparatus. The position of an object, for example, the substrate table, is in the known lithographic apparatus determined by employing a so-called zeroing system which is a stand-alone system in the sense that it is provided in addition to the interferometer system. A measured displacement may provide a position if the phase measurement is combined with a determination of a position by the zeroing system. The zeroing system provides, for instance, a position from which the displacement takes place. As such, the zeroing system in the prior art is a system which operates independently of the interferometer system. The zeroing system is in that sense another module of the known apparatus.

SUMMARY OF THE INVENTION

The principles of the present invention, as embodied and broadly described herein, provide a lithographic system with an interferometer system having less modules than conventional systems. In one embodiment, the lithographic apparatus, comprises a substrate holder configured to hold a substrate; an illuminator configured to condition a beam of radiation; a support structure configured to support a patterning device that imparts a desired pattern to the beam of radiation; a projection system that projects the patterned beam onto a target portion of the substrate; and an interferometer system configured to measure a position of the object to assist in positioning the object.

Such a configuration allows in a lithographic apparatus according to the invention for determining a position of an object using the interferometer system. There will be no need for a separate zeroing system, allowing for lesser modules in the lithographic apparatus.

This has several other advantages. It will for instance be possible to save time during the manufacturing of IC's as it is possible that zeroing takes place "on the fly", i.e. whilst interferometry is employed anyway. It is estimated that this will currently save between 0.1 and 1 second per wafer. As a stand alone zeroing system is no longer necessary, space may be saved in the apparatus. It is also possible that the apparatus will be cheaper to produce. Another advantage is that the part of the interferometer system which allows for measuring displacement and the part of the interferometer system which allows for zeroing and thus a position measurement, may be manufactured by one manufacturer as both of these parts are incorporated in the interferometer system. This minimizes the possibility that interconnection problems occur.

An interferometer system which is capable of determining an absolute optical path length difference between a measurement path and a reference path, i.e. a length difference expressed in an absolute unit of length between a measurement path and a reference path, is state of the art. The technology is often referred to as "absolute interferometry". Illustrative in this respect is, for instance, the Thesis "Novel interferometer to measure the figure of strongly spherical mirrors" (ISBN 90-9014583-4) of René Klaver and references mentioned therein. The thesis and the references mentioned therein are all by reference incorporated in this specification. Absolute interferometry has so far been used for a detailed study of surfaces of, for instance lenses and mirrors and in particular non spherical surfaces, which have a stable position in time. The accuracy of these surfaces is not determined by the polish techniques, but by the accuracy of the characterization of the surfaces. In the invention described in this specification, absolute interferometry is employed by an interferometer system which aids positioning movable objects within an apparatus.

In a description of an embodiment it will by way of example further be explained as to how a position of an object is established in an absolute manner.

An embodiment of a lithographic project apparatus according to the invention is arranged to carry out the position measurement using a plurality of frequencies of light. This has the advantage that the extra information provided i.e., the frequencies of light, can be used for measuring a position.

An embodiment of a lithographic projection apparatus according to the invention may comprise an interferometer system which is provided with a modulation system for applying a frequency modulation to light used by the interferometer system or for generating a periodically frequency-modulated beam of light. An advantage is that disturbance due to noise in the frequency of light used by the interferometer system may only have a minimal effect, if at all, on the position measurement. An interferometer system in a lithographic apparatus of the prior art uses light without frequency modulation. An output of the interferometer system of the known apparatus is a phase difference. Applying a frequency modulation to light used by the interferometer system, as done by a modulation system of this embodiment of the invention, will cause a response in the output of the interferometer system. This response is related to the frequency modulation and allows for determining a position of an object equipped with a mirror for reflecting light which has traveled along the measurement path. The frequency modulation may have for example a sinusoidal, trapezoidal, triangular or saw tooth like shape.

The interferometer system of a lithographic apparatus according to the invention can be arranged to measure a change of phase difference between light which has traveled along a measurement path and light which has traveled along a reference path. This change of phase is a response to the frequency modulation. The change of phase comprises information which enables the interferometer system to determine an absolute optical path length difference and hence a position of an object equipped with a mirror for reflecting light traveling along the measurement path.

In an embodiment the position measurement comprises determining a position of an object on the basis of the ratio of an amplitude (ΔN) of an interferometry signal to an amplitude (Δf) of the frequency modulation and on a correction for the medium in which the light travels, wherein the modulation has a sinusoidal shape and wherein the interferometry signal is a response to the frequency modulation. The interferometry signal comprises a number of fringes N as a function of time. It is relatively simple, an therefore cheap, as well as useful to establish the amplitude as one of the characteristics of the interferometry signal. The parameters ΔN and Δf are both easily established allowing for a simple and straightforward way of a position.

In an embodiment of a lithographic projection apparatus according to the invention, the interferometer system is provided with a response monitoring system for establishing the response to the frequency modulation. The response monitoring system allows for capturing the interferometry signal, for further processing and extracting information useful for establishing the absolute optical path length difference, and for determining the position. Such a response monitoring system may comprise a demodulator so that a modulation of the interferometry signal as a response to the modulation of light used in the interferometer, can be demodulated. Such a demodulator may for instance comprise a lock-in detector, known in itself.

In an embodiment of a lithographic projection apparatus according to the invention, the interferometer system may be arranged to use at least two different frequencies of light, wherein each frequency of light is used for a first light beam which travels along a measurement path and for a second beam of light which travels along a reference path. This embodiment provides an alternative for the embodiment wherein the interferometer system is provided with a modulation system for applying a frequency modulation to light used by the interferometer system. As explained in detail in René Klaver's thesis, section 6.2.5 and references mentioned therein, this allows for the determination of an absolute optical path length difference, and thus for the determination of an absolute position.

In an embodiment of a lithographic projection apparatus according to the invention, the interferometer system is arranged to carry out the position measurement such that an approximate position is determined with a total uncertainty range which is less than a distance corresponding to a single fringe which is observed when a phase measurement is carried out with the interferometer system. It is possible that a phase scale on which an outcome of a phase measurement can be expressed is related by a predetermined relationship with a length scale on which an outcome of a position measurement can be expressed. In that case the interferometer system of a lithographic apparatus according to the invention can be arranged to carry out a phase measurement and a position measurement and further be arranged to determine on the basis of the approximate position and the phase measurement an accurate position by taking the predetermined relationship into account and selecting a position which corresponds to both the approximate position and the outcome of the phase measurement. This allows for a very accurate position measurement.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
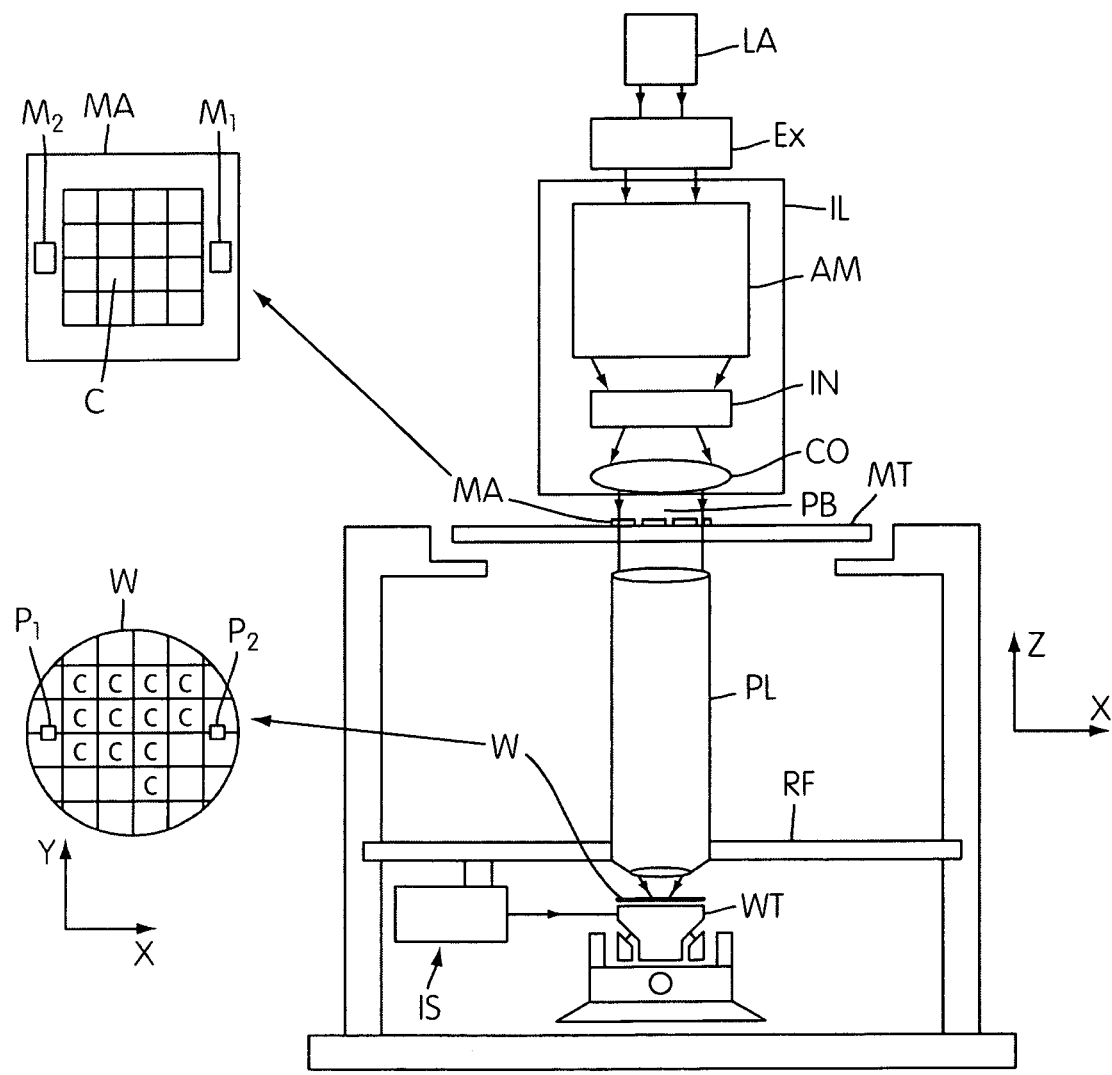
FIG. 1 depicts a lithographic apparatus according to an embodiment of the invention.

FIG. 1 schematically depicts a lithographic projection apparatus 1 according to a particular embodiment of the invention. The apparatus comprises:

- a radiation system Ex, IL: for supplying a projection beam PB of radiation (e.g. EUV, DUV, or UV radiation). In this particular case, the radiation system also comprises a radiation source LA;
- a first object table (mask table/holder/holder) MT: provided with a mask holder for holding a mask MA (e.g. a reticle), and connected to first positioning mechanism for accurately positioning the mask with respect to item PL;
- a second object table (substrate table/holder) WT: provided with a substrate holder for holding a substrate W (e.g. a resist-coated silicon wafer), and connected to second positioning mechanism for accurately positioning the substrate with respect to item PL;
- a projection system ("lens") PL: for example, a mirror or refractive lens system that images an irradiated portion of the mask MA onto a target portion C (comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA (e.g. a laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning mechanism PW (and interferometric measuring mechanism IF), the substrate table WT can be moved accurately, e.g. so as to position different target portions C in the path of the beam PB. Similarly, the first positioning mechanism PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in different modes:
step mode: the mask table MT is kept essentially stationary, and an entire mask image is projected in one go (i.e. a single "flash") onto a target portion C. The substrate table WT is then shifted in the X and/or Y directions so that a different target portion C can be irradiated by the beam PB;
scan mode; essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=M v, in which M is the magnification of the lens PL (typically, M=¼ or ⅕). In this manner, a relatively large target portion C can be exposed, without having to compromise on resolution; and
other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 2:
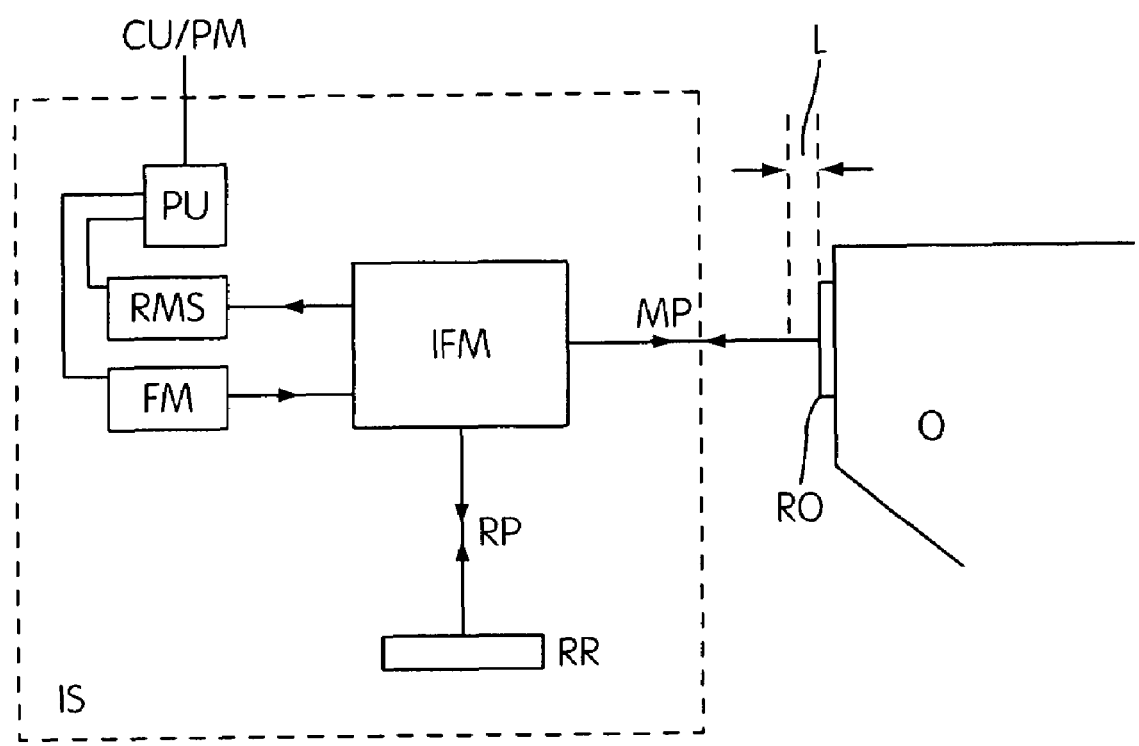
FIG. 2 depicts schematically the interferometer system in a lithographic projection apparatus according to an embodiment of the invention.

FIG. 2 depicts schematically an embodiment of such an interferometer system IS. The interferometer system IS is provided with a modulation system FM that produces frequency-modulated light. To produce frequency-modulated light, modulation system FM may, for example, frequency-modulate the light used by the interferometer system or may generate a periodic, frequency-modulated beam of light. In addition, the frequency modulation may be configured to have a predetermined characteristic, such as, for example, a sinusoidal, trapezoidal, triangular, or saw-tooth like shape.

The interferometer IFM splits the light and a part of that light is directed along a measurement path MP to and from a reflector RO placed on an object O of which the position needs to be determined. Another part of that light is directed along a reference path RP to and from a reference reflector RR. The position of the reference reflector is stable in time.

When the light which has traveled along the reference path RP, i.e., the reference beam, and the light which has traveled along the measurement path MP, i.e., the measurement beam, recombine, interference of light may occur, provided that the measurement beam and the reference beam are at least partly equally polarized. Depending on the differences in optical path length between the reference path RP and the measurement path MP and on the phase of the light at the point of interference, the light from the reference light beam and light from the measurement light beam may be totally constructive, totally destructive, or anything in between. One full cycle of light intensity variation is generally known as a fringe.

As the frequency of light used by the interferometer system IS is modulated, fringes or parts thereof, occur also due to the change in frequency. In other words, due to frequency modulation fringes or parts thereof may also occur when the object of which the position needs to be determined is stable, i.e. not moving during the measurement, as long as the reference path RP and the measurement path MP are of unequal length. A difference in optical path length between the reference path RP and the measurement path MP is then observed in an interferometry signal, which is a response to the frequency modulation to light used by the interferometer system IS and comprises a number of fringes N as a function of time.

The interferometer system IS is arranged to measure a change of phase difference between light which has traveled along the measurement path MP and light which has traveled along the reference path RP. For that purpose, the interferometer system IS may be provided with a response monitoring system RMS for establishing the response to the frequency modulation, in this case the interferometry signal. The position measurement comprises in its simplest form determining the absolute optical path length difference L between the reference path and the measurement path.

A more detailed explanation as to how the determination of the optical path length difference L occurs is as follows. The frequency f of the light used by the interferometer system may due to the modulation behave according to $$f = f_0 + \Delta f \sin(\omega_f t) \quad (1),$$

wherein $f_0$ is the nominal frequency, $\Delta f$ the amplitude of the frequency modulation set as a predetermined constant, $\omega_f$ the modulation angular frequency, and t the time. The response monitoring system measures the response to the frequency modulation, i.e. the interferometry signal, which can in this case be described as $$N = N_0 + \Delta N \sin(\omega_f t) \quad (2),$$

$N_0$ being a nominal part, i.e. the value N would have if $\Delta f$ is zero. From a modulation part $\Delta N \sin(\omega_f t)$ of the interferometry signal, the amplitude $\Delta N$ is determined. In practice the modulation part is deducible from the interferometry signal using a demodulation technique, known in itself.

The absolute optical path length difference L is then determined as $$L = \frac{c}{n} \frac{\Delta N}{\Delta f}, \quad (3)$$

wherein c is the speed of light in vacuum, and n is the index of refraction of the medium in which the light travels. A basis for this determination is as follows. As $$N = \frac{L}{\lambda} = n\frac{L}{c}f = n\frac{L}{c}(f_0 + \Delta f \sin(\omega_f t)), \quad (4)$$

wherein $\lambda$ is the time dependent wavelength of light in air used by the interferometer system, and $$N_0 = n\frac{L}{c}f_0 \quad (5)$$

it follows from equating (2) and (4) and substituting (5) that $$\Delta N \sin(\omega_f t) = n\frac{L}{c}\Delta f \sin(\omega_f t), \quad (6)$$

leading to equation (3) for determining the absolute optical path length difference L.

The modulation system FM may comprise a frequency tunable semiconductor laser which is commercially available. For improving the frequency stability the semiconductor laser can be stabilized by a stabilized Helium Neon laser and a frequency locked loop, known in the art. A small part of the semiconductor laser light can be mixed with the Helium Neon laser light and generates a so-called beat signal. The frequency of the beat signal is equal to the difference between the two laser frequencies. The frequency of the beat signal, $\Delta f$, can be measured by a frequency counter and can be sent to a processing unit PU which is arranged to determine the optical path length difference L.

The frequency counter may also be used to close the loop around the tunable semiconductor laser. The frequency modulation is in this case added as a set point. The tunable laser may require a voltage as input. In that case the modulation system may also comprise a frequency to voltage converter.

In case heterodyne phase detection is used, the main part of the semiconductor laser light is split in two cross polarised beams. A frequency difference between the two cross polarised beams can be obtained using one or two acousto-optic modulators (AOMs)

The response monitoring system may comprise a demodulator such as lock-in detector or lock in amplifier, both well known in the art and commercially available. This response monitoring system may also determine $\Delta N$ although also standard electronics present in the interferometer IFM may be capable of determining $\Delta N$. The interferometer system IS may be provided with a processing unit (PU) for carrying out the determination of the optical path length difference L from $\Delta f$ and $\Delta N$.

The speed of light c in vacuum can be stored in the processing unit PU as a known constant of nature. The index of refraction n of the medium in which the light travels may be estimated based on temperature, pressure and composition of the medium, or be determined otherwise and then stored in the processing unit PU. The optical path length difference L can be determined and expressed in a unit of length. The position of the interferometer IFM is stable in time. The actual position of the reflector RO with respect to the interferometer IFM is then related to the sum of the length of the reference path RP and the optical path length difference L. The processing unit PU determines the optical path length difference L and hence the position of reflector RO with respect to the interferometer IFM (the length of the reference path RP being stored as a predetermined constant in the processing unit PU).

Instead of a modulation system, the interferometer system IS may, in order to carry out position measurements, be arranged to use at least two different frequencies of light, wherein each frequency of light is used for a first light beam which travels along a measurement path MP and for a second beam of light which travels along a reference path RP. This also allows for the determination of an absolute optical path length difference as explained in more detail in René Klaver's thesis, section 6.2.5 and references mentioned therein.

In a further embodiment, the interferometer system IS may be arranged to carry out the position measurement such that an approximate position is determined with a total uncertainty which is less than a distance corresponding to a single fringe which is observed when a displacement measurement is carried out with the interferometer system. This is, for instance, possible if a modulation frequency of 20 GHz can be are reached and measured. With accurate phase detection electronics combined with an accurate lock-in detector it is possible to determine $\Delta N$ with an uncertainty of about $2 \cdot 10^{-5}$. For such an embodiment, a phase scale, on which the outcome of a phase measurement can be expressed, is related by a predetermined relationship with a length scale, on which an outcome of a position measurement can be expressed. This predetermined relationship provides information related to the length of the length scale which corresponds to a single fringe of the phase scale as well as an offset between the length scale and the phase scale.

In such an embodiment, the interferometer system IS may further be arranged to carry out a phase measurement in addition to the position measurement and to determine on the basis of the approximate position and the phase measurement an accurate position by taking into account the predetermined relationship and by selecting as the accurate position a position which corresponds to both the approximate position and the outcome of the phase measurement.

Figure 3:
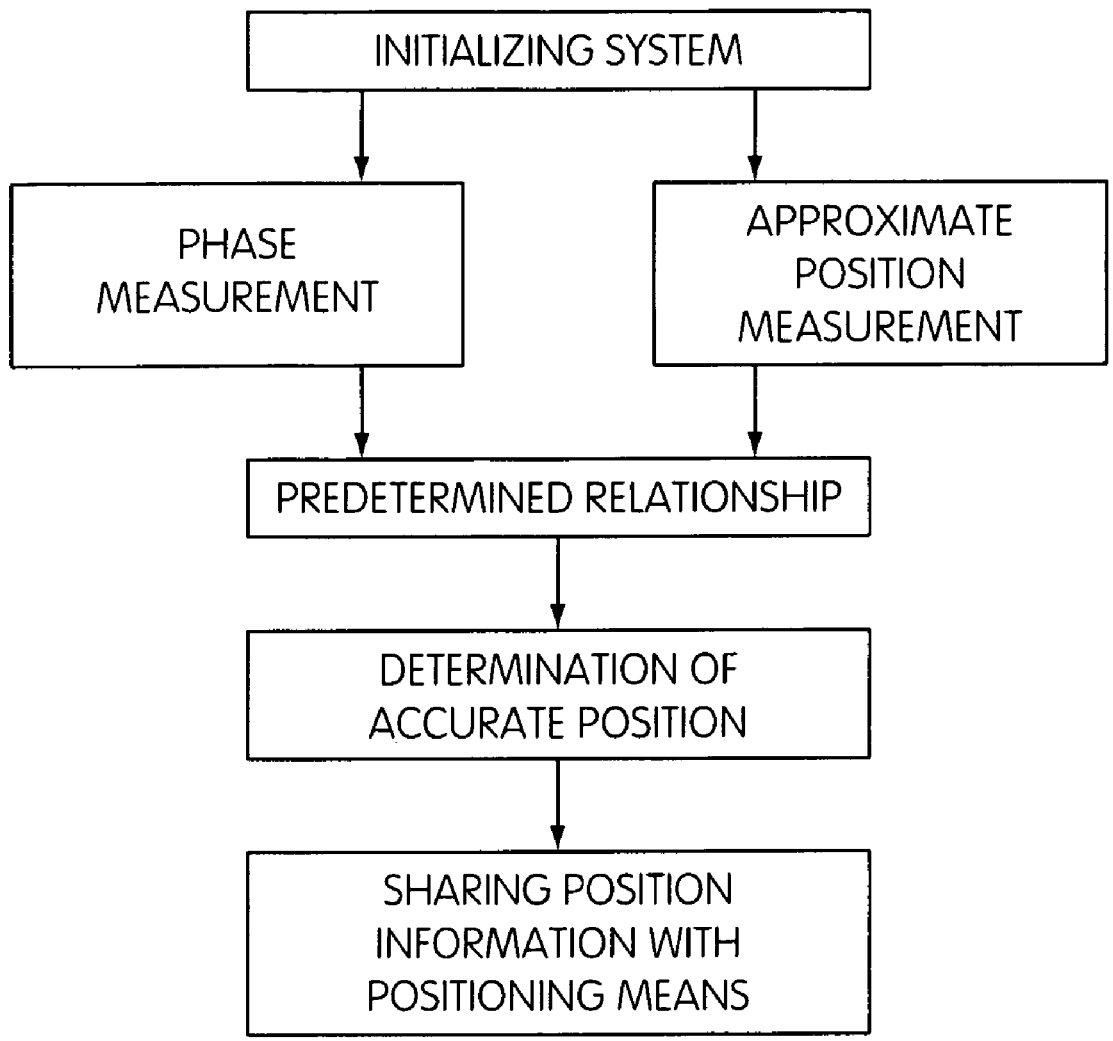
FIG. 3 depicts schematically a workflow for carrying out a position measurement by a lithographic projection apparatus according to an embodiment of the invention.

FIG. 3 schematically depicts a workflow for carrying out a position measurement by a lithographic apparatus according to an embodiment of the invention. The interferometer system IS is first initialized. The object of which the position needs to be determined may have to be moved such that the mirror RO of that object is positioned such that the interferometer can measure a phase difference between light which travels along a reference path RP and light which travels along a measurement path MP.

At a particular time, say t=0, a phase difference is measured and arbitrarily related to a position x1(t=0). When a phase measurement, as is known in the art, is carried out by the interferometer IFM, a phase $\phi$ of the interference fringe, for instance expressed as a number between zero (included) and one (excluded), is obtained. An integer k is incremented by one whenever $\phi$ changes from one to zero, and decremented by one whenever $\phi$ changes from zero to one. Based on $\phi$ and k an actual displacement of $(\phi+k)\lambda/q$ where $\lambda$ is the wavelength in air of the light used by the interferometer, and q a scale factor which corresponds to the number of fringes observable for a displacement equal to $\lambda$.

Figure 4:
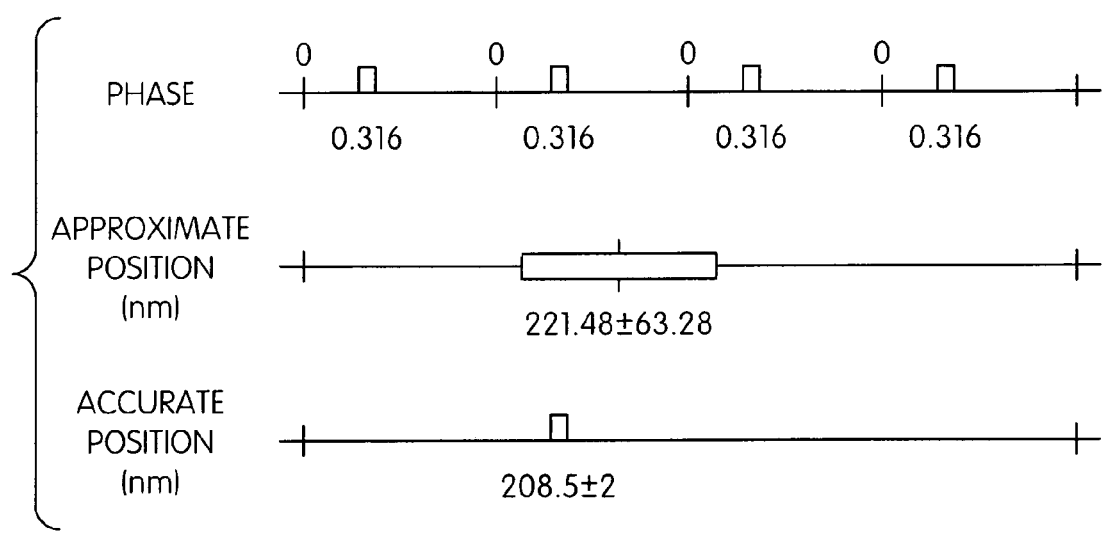
FIG. 4 depicts schematically a determination of an accurate position on the basis of a position measurement and a phase measurement.

Those skilled in the art will notice that $\phi$ can be determined at any time, in contrast to k which can only be determined relative to a previously known or assumed k. FIG. 4 shows an example in which phase $\phi$ is obtained as 0.316. The actual displacement may in that case be 50 nm, 208.5 nm, 366.7 nm etc. when $\lambda$ is assumed to be equal to 623.8 nm and q is equal to 4.

The approximate position of the mirror RO at t=0 is also measured by carrying out a position measurement as explained above. This approximate position may, for instance, be x2(t=0). It is now possible to determine an offset between the position as set arbitrarily and the position as measured. It is possible that the phase is measured as a function of time and that the position is measured as a function of time, possibly allowing for a more accurate offset. This part of the workflow entails the "zeroing" of the interferometer, which is capable of measuring displacements by phase measurements.

The offset, as determined, will form at least a part of the predetermined relationship. The length of the length scale which corresponds to a single fringe, which forms another part of the predetermined relationship will in practice most likely have been established by a manufacturer of the interferometer system. With the predetermined relationship it is possible to determine more accurately a position of an object.

As shown in FIG. 4, a phase measurement may reveal a phase of 0.316. For the sake of the explanation, it is assumed that the total uncertainty range of a displacement as obtained from this phase measurement is ±2 nm. An approximate position measurement as carried out by the interferometer system IS according to the invention may reveal a position of 221.48±63.28 nm.

The accurate position of the object is determined, by taking the predetermined relationship into account and by selecting a position which corresponds to both the approximate position and the outcome of the phase measurement, as schematically shown in FIG. 4. The accurate position is determined to be 208.5±2 nm. This information may then be shared with a positioning mechanism of the apparatus, to allow for an accurate positioning of at least one object within the apparatus (see, FIG. 3), or other parts of the apparatus such as parts belonging to the alignment system. In FIG. 2 this is indicated with a line from the processing unit PU to CU/PM.

It should be noted that an approximate position measurement may also be carried out by a zeroing system, i.e., by a system that is different from the interferometer system IS as depicted in FIG. 2 and as described in the explanation of FIG. 2. This zeroing system may be a stand-alone system. This zeroing system should still be able to carry out a position measurement such that an approximate position is determined with a total uncertainty range, which is less than a distance corresponding to a single fringe which is observed when a phase measurement is carried out with the interferometer system IS.

Also in this case a phase scale on which an outcome of a displacement measurement can be expressed, should be related by a predetermined relationship with a length scale on which an outcome of a position measurement can be expressed.

A method for determining the accurate position of an object includes:
  (a) employing an interferometer to measure a phase difference between a reference path RP and a measurement path MP, wherein the object is placed in the measurement path MP, movable along the measurement path MP and provided with a reflective element for reflecting light that travels along the measurement path MP;
  (b) measuring an approximate position with a total uncertainty range that is less than a distance corresponding to a single fringe, which is observed using the interferometer for measuring the phase difference;
  (c) determining a relationship between a phase scale on which the phase difference can be expressed and a length scale on which the approximate position can be expressed;
  (d) determining the accurate position based on the relationship and selecting as the accurate position the position which corresponds to both the approximate position and the measured phase difference.

The approximate position may be determined by a stand-alone zeroing system or with an interferometer which is arranged to carry out a position measurement as explained in this specification.

It will be clear to a person skilled in the art that the object may be any moveable object within the apparatus. It will equally be clear that the interferometer system according to the invention may be used for establishing a position related to any degree of freedom on which information is needed.

The invention is not limited to the above described example. Instead of applying a frequency modulation to light used by the interferometer system, it is possible that the interferometer system is arranged to use at least two different frequencies of light, wherein each frequency of light is used for a first beam of light which travels along a measurement path and a second beam of light which travels along a reference path.

While specific embodiments of the invention have been described above, it will be appreciated that the invention may be practiced otherwise than as described. The description is not intended to limit the invention—rather the scope of the invention is defined by the appended claims.

What is claimed is:
1. A lithographic apparatus, comprising:
  a substrate holder configured to hold a substrate;
  an illuminator configured to condition a beam of radiation;
  a support structure configured to support a patterning device that imparts a desired pattern to the beam of radiation;
  a projection system configured to project the patterned beam onto a target portion of the substrate; and
  a unitary measurement and zeroing interferometer system configured to measure an absolute position of an object to assist a singularly driven interferometer device in positioning the object, the system including a modulation system configured to modulate a frequency of a radiation beam to form a modulated radiation beam, the modulated radiation beam split within the unitary measurement and zeroing interferometer system into a first modulated radiation beam that propagates along a measurement path that extends between the unitary measurement and zeroing interferometer system and the object and a second modulated radiation beam that propagates along a reference path, a response monitoring system configured to measure an interferometry signal obtained by interference between the first and second modulated radiation beams, and a processing unit configured to determine an absolute path length difference between the measurement and the reference paths based on the interferometry signal and the frequency modulation of the modulation system, the absolute path length difference being proportional to a ratio between an amplitude of the interferometry signal and an amplitude of the frequency modulation.

2. The lithographic apparatus of claim 1, wherein the interferometer system is configured to measure the position of the object by employing a plurality of light frequencies.

3. The lithographic apparatus of claim 1, wherein the frequency modulation comprises modulating the frequency of the radiation beam used by the interferometer system or generating a periodic frequency modulated radiation beam.

4. The lithographic apparatus of claim 1, wherein the frequency modulation comprises a sinusoidal, trapezoidal, triangular, or saw-tooth like characteristic.

5. The lithographic apparatus of claim 1, wherein the interferometer system is configured to measure a change of phase difference between the modulated radiation beam which has traveled along the measurement path and the modulated radiation beam which has traveled along the reference path and wherein the change of phase difference comprises a response to the frequency modulation.

6. The lithographic apparatus of claim 1, wherein the position of the object measured by the interferometer system comprises:
a correction for the medium in which the modulated radiation beam travels,
wherein the modulation has a pre-specified characteristic shape and the interferometry signal comprises a response to the frequency modulation that includes a number of fringes as a function of time.

7. The lithographic apparatus of claim 1, wherein the response monitoring system comprises a demodulator.

8. The apparatus of claim 1, wherein the modulated radiation beam is centered on a nominal frequency and includes a component that varies in time.

9. A lithographic apparatus, comprising:
a substrate holder configured to hold a substrate;
an illuminator configured to condition a beam of radiation;
a support structure configured to support a patterning device that imparts a desired pattern to the beam of radiation;
a projection system configured to project the patterned beam onto a target portion of the substrate; and
a unitary measurement and zeroing interferometer system configured to measure an absolute position of an object to assist a singularly driven interferometer device in positioning the object, the interferometer system configured to employ at least two different frequencies of light, wherein each frequency of light is used for a first beam of light which travels along a measurement path and for a second beam of light which travels along a reference path, the system comprising a processing unit configured to determine an absolute path length difference between the measurement and the reference paths based on interference of the first and second beams of light,
wherein the interferometer system is configured to measure the position of the object based on an approximate position determined with a total uncertainty range that is less than a distance corresponding to a single fringe determined by a phase measurement of the interferometer system.

10. The lithographic apparatus of claim 9, wherein a phase scale, by which the measured phase is expressed, has a predetermined relationship with a length scale, by which the measured position of the object is expressed.

11. The lithographic apparatus of claim 10, wherein the interferometer system is configured to:
measure the phase,
determine an accurate position based on the approximate position, the phase measurement, and the predetermined relationship, and
select, as the accurate position, a position which corresponds to both the approximate position and the measured phase.

12. A lithographic apparatus, comprising:
a substrate holder configured to hold a substrate;
an illuminator configured to condition a beam of radiation;
a support structure configured to support a patterning device that imparts a desired pattern to the beam of radiation;
a projection system configured to project the patterned beam onto a target portion of the substrate; and
a unitary measurement and zeroing interferometer system configured to assist a singularly driven interferometer device which generates a periodically frequency-modulated radiation beam in positioning an object, the system including a modulation system configured to modulate a frequency of the radiation beam to form a modulated radiation beam, the modulated radiation beam split within the unitary measurement and zeroing interferometer system into a first modulated radiation beam that propagates along a measurement path that extends between the unitary measurement and zeroing interferometer system and the object and a second modulated radiation beam that propagates along a reference path, and a processing unit configured to determine an absolute path length difference between the measurement and the reference paths based on interference of the first and second modulated radiation beams;
a zeroing system configured to determine an absolute position of the object based on determining an approximate position having a total uncertainty range which is less than a distance corresponding to a single fringe determined by a phase measurement of the singularly driven interferometer device.

13. The lithographic apparatus of claim 12, wherein a phase scale, by which the measured phase is expressed, has a predetermined relationship with a length scale, by which a measured position of the object is expressed.

14. The lithographic apparatus of claim 12, wherein the interferometer system is configured to measure a phase, the zeroing system is configured to measure an approximate position, and an accurate position is determined based on the approximate position, the phase measurement, and the predetermined relationship, and wherein the accurate position is selected as a position which corresponds to both the approximate position and the measured phase.

15. The lithographic apparatus of claim 12, wherein the zeroing system comprises part of the interferometer system.

16. The lithographic apparatus of claim 15, wherein the interferometer system comprises a modulation system that produces frequency modulation.

17. The lithographic apparatus of claim 16, wherein the frequency modulation comprises a sinusoidal, trapezoidal, triangular, or saw-tooth like characteristic.

18. The lithographic apparatus of claim 16, wherein the interferometer system is configured to measure a change of phase difference between the modulated radiation beam which has traveled along the measurement path and the modulated radiation beam which has traveled along the reference path and wherein the change of phase difference comprises a response to the frequency modulation.

19. The lithographic apparatus of claim 16, wherein the position of the object measured by the interferometer system comprises:
    determining a position of the object based on a ratio of an amplitude of an interferometry signal to an amplitude of the frequency modulation, and
    a correction for the medium in which the modulated radiation beam travels,
    wherein the modulation has a pre-specified characteristic shape and the interferometry signal comprises a response to the frequency modulation that includes a number of fringes as a function of time.

20. The lithographic apparatus of claim 18, wherein the interferometer system further comprises a response monitoring system that establishes the response to the frequency modulation.

21. The lithographic apparatus of claim 20, wherein the response monitoring system comprises a demodulator.

22. An unitary measurement and zeroing interferometer system that measures an absolute position of an object, comprising:
    a modulation system configured to modulate a frequency of a radiation beam to form a modulated radiation beam, the modulated radiation beam split within the unitary measurement and zeroing interferometer system into a first modulated radiation beam that propagates along a measurement path that extends between the unitary measurement and zeroing interferometer system and the object and a second modulated radiation beam that propagates along a reference path;
    a response monitoring system configured to measure an interferometry signal obtained by interference of the first and second modulated radiation beams; and
    a processing unit configured to determine an absolute path length difference between the measurement and the reference paths based on the interferometry signal and the frequency modulation of the modulation system, the absolute path length difference being proportional to a ratio between an amplitude of the interferometry signal and an amplitude of the frequency modulation.

23. A method of determining an accurate position of an object comprising:
    measuring a change of a phase difference of frequency-modulated light from a singularly driven interferometer device between a reference path and a measurement path, wherein the object is placed in the measurement path and is provided with a reflective element for reflecting light that travels along the measurement path;
    measuring an approximate position with a total uncertainty range which is less than a distance corresponding to a single fringe based on the measured phase difference;
    determining a relationship between a phase scale by which the phase difference is expressed and a length scale by which the approximate position is expressed;
    determining the accurate position based on the phase scale and length scale relationship; and
    selecting, as the accurate position, a position which corresponds to the approximate position and the measured change of the phase difference.

24. The method of claim 23, wherein the measured phase change is determined by an interferometer.

25. The method of claim 23, wherein the approximate position is determined by an interferometer.

* * * * *